(12) United States Patent
Wang et al.

(10) Patent No.: US 6,972,259 B2
(45) Date of Patent: Dec. 6, 2005

(54) METHOD FOR FORMING OPENINGS IN LOW DIELECTRIC CONSTANT MATERIAL LAYER

(75) Inventors: Chih-Jung Wang, Hsinchu (TW); Tong-Yu Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 318 days.

(21) Appl. No.: 10/291,911

(22) Filed: Nov. 13, 2002

(65) Prior Publication Data
US 2003/0129844 A1 Jul. 10, 2003

Related U.S. Application Data

(63) Continuation-in-part of application No. 10/044,322, filed on Jan. 10, 2002, now Pat. No. 6,638,871.

(51) Int. Cl.[7] ............................................. H01L 21/302
(52) U.S. Cl. ...................... 438/694; 438/698; 438/699; 438/700; 438/708; 438/724
(58) Field of Search .............................. 438/694, 698, 438/699, 700, 708, 724

(56) References Cited

U.S. PATENT DOCUMENTS 6,323,121 B1 * 11/2001 Liu et al. ................... 438/633
6,444,557 B1 * 9/2002 Biolsi et al. ................ 438/597

* cited by examiner

Primary Examiner—Nadine G. Norton
Assistant Examiner—Binh X. Tran
(74) Attorney, Agent, or Firm—J.C. Patents

(57) ABSTRACT

The invention is directed towards a method for forming openings in low-k dielectric layers and a structure for forming an opening thereof. A mask layer comprising at least one metal hard mask layer and one or more hard mask layers is applied on the dielectric layer for forming the opening.

14 Claims, 10 Drawing Sheets

METHOD FOR FORMING OPENINGS IN LOW DIELECTRIC CONSTANT MATERIAL LAYER

CROSS-REFERENCE TO RELATED APPLICATION

This application is a continuation-in-part of prior applications Ser. No. 10/044,322, filed Jan. 10, 2002 now U.S. Pat. No. 6,638,871.

BACKGROUND OF THE INVENTION

1. Field of Invention

The present invention relates to a method for manufacturing semiconductor devices. More particularly, the present invention relates to a method for forming openings in dielectric material layers.

2. Description of Related Art

In the semiconductor fabrication process, as the dimension of devices on a chip becomes smaller, the density of interconnect pitch becomes higher. Because widely used silicon oxide dielectric layers have high dielectric constants, it can easily result in high RC delay. Therefore, low dielectric constant (low-k) dielectric material is used instead as an inter-metal dielectric (IMD) in high speed ICs. To apply low k dielectric has the advantage such as reducing the interconnection parasitic capacitance, consequently reducing the RC delay, or mitigating the cross talk between metal lines, hence, the operation speed is improved. Hence, the low k dielectric material is a very popular IMD material used in high speed ICs.

The low k dielectric materials include inorganic materials, such as HSQ, FSG and CORAL, and organic materials, such as flare, SILK and parylene.

In the conventional via-first process for forming damascene opening, as shown in FIG. 1, a cap nitride layer 102 is formed over metal interconnects (not shown) within a provided substrate 100. Afterwards, a first low-k dielectric layer 104, a stop layer 106, a second low-k dielectric layer 108, a chemical mechanical polishing (CMP) stop layer 110 and a bottom anti-reflection coating (BARC) layer (not shown) are formed in sequence on the cap nitride layer. Then, a patterned first photoresist layer is formed on the BARC layer for defining vias. By using the first photoresist layer as a mask and the cap nitride layer is used as an etching stop layer, a first anisotropic etching process is performed through the layers to form a via opening.

After removing the first photoresist layer, a gap filling process is performed to fill the via with a polymer material layer to protect the cap nitride layer. After a patterned second photoresist layer is formed on the polymer material layer, a second anisotropic etching process is performed to define a trench, by using the stop layer as an etching stop layer. FIG. 1 shows a prior-art damascene opening structure manufactured by the cited above process.

However, the polymer material layer covering the via opening provokes a fence profile 110 around top of the opening 120, as shown in FIG. 1. It is because the polymer material layer hinders the etching, resulting in incomplete removal of the second low-k dielectric layer 108.

Furthermore, while the second photoresist layer is subsequently stripped by a photoresist removal process, such as a nitrogen/oxygen plasma ashing process or a nitrogen/hydrogen plasma process, the performed photoresist removal process usually damages the side walls 107 of the second dielectric layer 108, leading to dielectric constant shift of the low-k dielectric layer. Moreover, the low-k dielectric material of the damaged sidewalls 107 tends to absorb moisture, resulting in degradation in the follow-up metallization process.

SUMMARY OF THE INVENTION

It is therefore an object of the invention to provide a method for forming openings in the dielectric material layer. The disadvantage of photoresist striping by plasma is improved, and no fence profile is provoked. Therefore, it is more advantageous for the fabrication for forming openings in low-k material layers, especially the low-k material layers containing metal wires or interconnects.

To achieve these objects and advantages, and in accordance with the purpose of the invention, as embodied and broadly described herein, the invention is directed towards a method for forming openings in a dielectric layer and a structure with an opening in the dielectric layer. A dielectric layer is formed over the provided substrate, and the dielectric layer can be a single layer or comprises stack dielectric layers of different dielectric materials. Preferably, the dielectric layer is a low-k dielectric layer. A mask layer comprising at least a metal hard mask layer and a hard mask layer and a first anti-reflection layer are formed on the dielectric layer. A stop layer can be further included in the mask layer. The usage of the metal hard mask layer and the hard mask layer is one of the advantageous features of the present invention. After patterning the mask layer, a second anti-reflection layer is formed. Using a patterned second photoresist layer formed on the second anti-reflection layer as a mask, a via opening is defined. After removing the second photoresist layer along with the second antireflection layer, a damascene opening is formed by using the mask layer as a mask.

The resultant structure with a damascene opening at least comprising: the substrate, the dielectric layer with the damascene opening and the patterned mask layer that includes at least one metal hard mask layer and one or more hard mask layers on the dielectric layer. Before the mask layer is patterned, the structure for forming the opening further includes an anti-reflection layer on the mask layer.

By using the patterned mask layer comprising at least a metal hard mask layer as a mask along with the gap-filling anti-reflection layer, the dielectric layer is protected from plasma damage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A–2I are cross-sectional views of the process steps for forming a damascene opening in low-k material layers according to one preferred embodiment of this invention.

Figure 1:
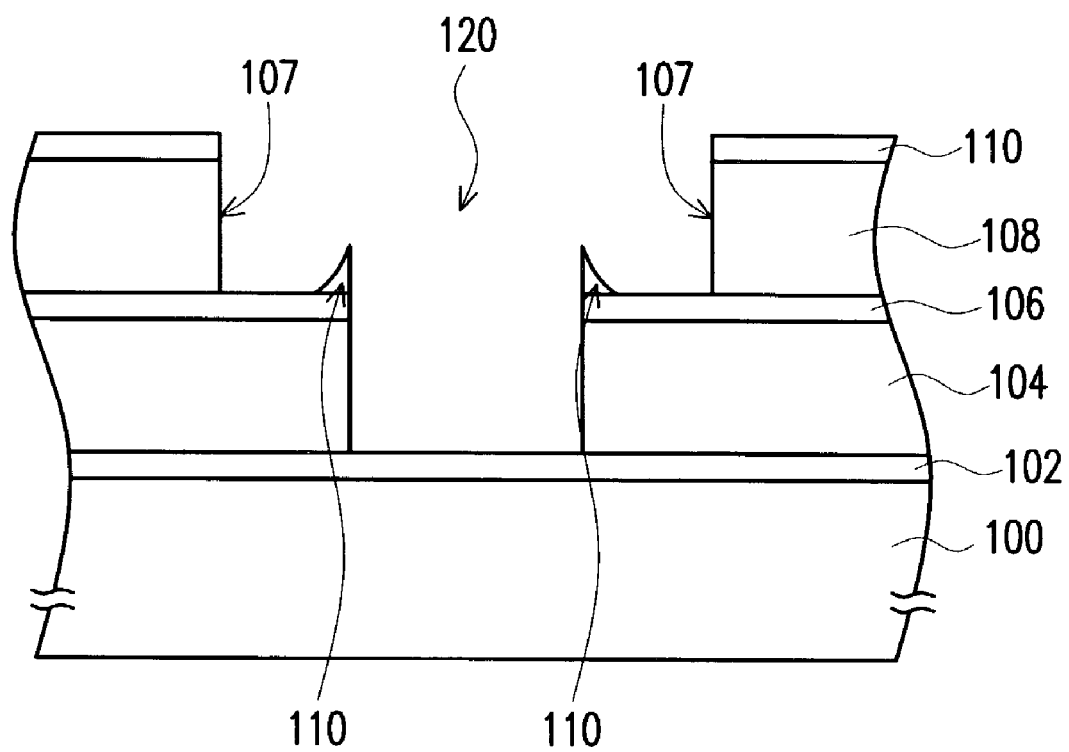
FIG. 1 shows a prior art damascene opening structure manufactured by the conventional via-first process for forming damascene openings.
Figure 2A:
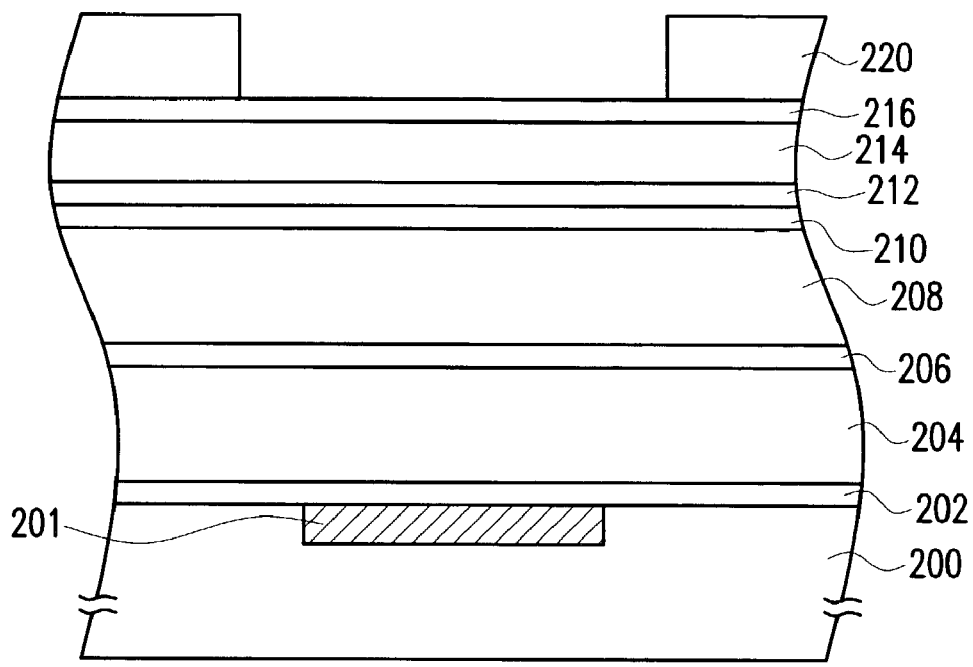
FIGS. 2A–2I are cross-sectional views of the process steps for forming a damascene opening in low-k material layers according to one preferred embodiment of this invention.

Referring to FIG. 2A, a semiconductor substrate 200 having metal wires 201 formed thereon is provided. A cap layer 202 is formed over the substrate 200 and the metal wires 201. The cap layer is, for example, a nitride layer with a thickness of about 400–700 Å, preferably 500 Å. Afterwards, a first dielectric layer 204, an etch stop layer 206 and a second dielectric layer 208 are formed in sequence on the cap nitride layer 202. The first and second dielectric layers 204, 208 are low-k dielectric layers made of, for example, an inorganic polymer containing silicon, such as CORAL™ or Black Diamond™. The first and second dielectric layers 204, 208 are formed by, for example, CVD with a thickness of about 2000 Å to 3000 Å. The thickness of the dielectric layers is adjustable, depending on the structure formed on the substrate 200. The etch stop layer 206 is, for example, a silicon nitride layer or a silicon carbide layer with a thickness of about 400–700 Å, preferably 500 Å. Alternatively, the etch stop layer can be omitted.

Afterwards, a chemical mechanical polishing (CMP) stop layer 210, a metal hard mask layer 212, a hard mask layer 214 and a bottom anti-reflection coating (BARC) layer 216 are formed in sequence on the second dielectric layer 208. The CMP stop layer 210 is, for example, a silicon nitride layer or a silicon carbide layer with a thickness of about 400–700 Å, preferably 500 Å. Materials for forming the metal hard mask layer 212 includes tantalum, tantalum nitride, tungsten, tungsten nitride, titanium nitride and titanium, formed by, for example, CVD or sputtering. The metal hard mask layer 212 has a thickness of about 100–300 Å, preferably 200 Å. The hard mask layer 214 is, for example, a silicon nitride layer or a silicon carbide layer with a thickness of about 1000–2000 Å, preferably 1500 Å. The formation of the metal hard mask layer and the hard mask layer is one of the advantageous features of the present invention.

Afterwards, a patterned first photoresist layer 220 is formed on the BARC layer 216.

Figure 2B:
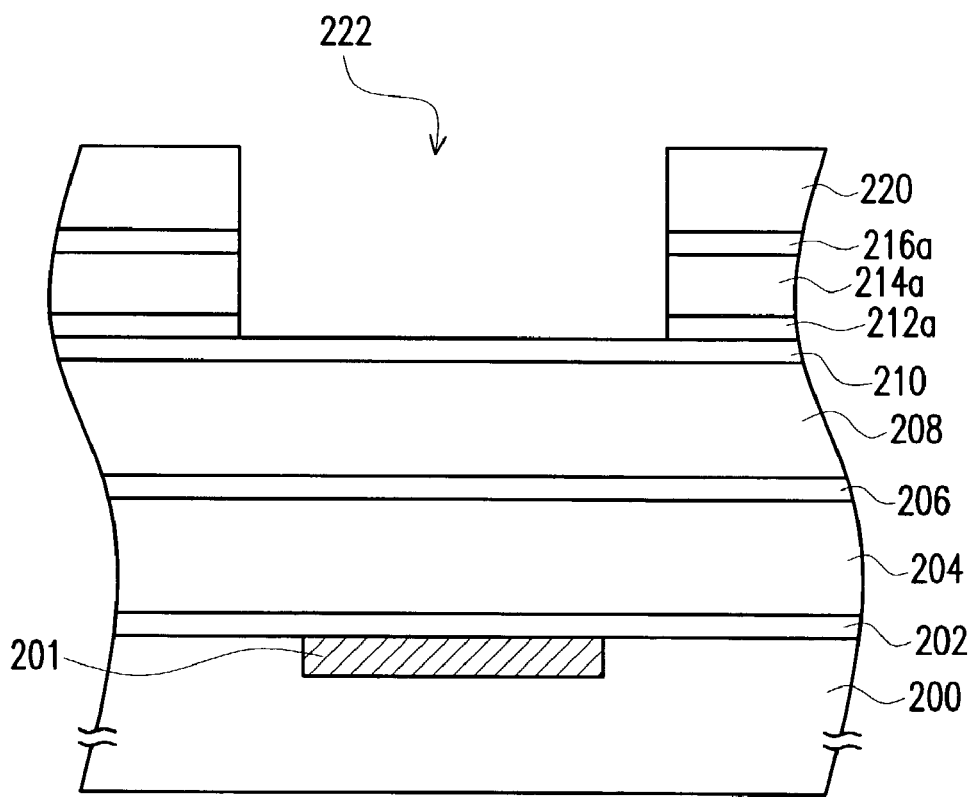

Referring to FIG. 2B, using the patterned photoresist layer 220 as a mask, the BARC layer 216, the hard mask layer 214 and the metal hard mask layer 212 are partially removed until the CMP stop layer 210 is exposed. An opening 222 is thus formed within the BARC layer 216a, the patterned hard mask layer 214a and the metal hard mask layer 212a.

Figure 2C:
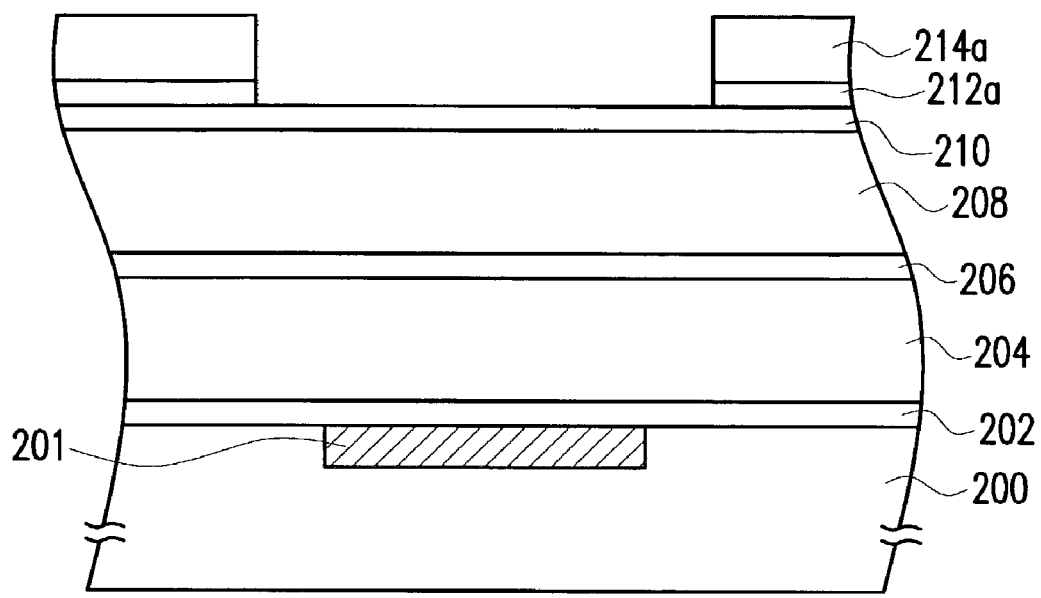

Referring to FIG. 2C, using plasma as a clean agent, the first photoresist layer 220 is removed. Because the material of the BARC layer 216 is similar to the material of the photoresist layer 220, the BARC layer 216a is removed along with the first photoresist layer 220. Because the dielectric layers 204, 208 are protected by the CMP stop layer and not exposed to plasma, damage is thus avoided.

Figure 2D:
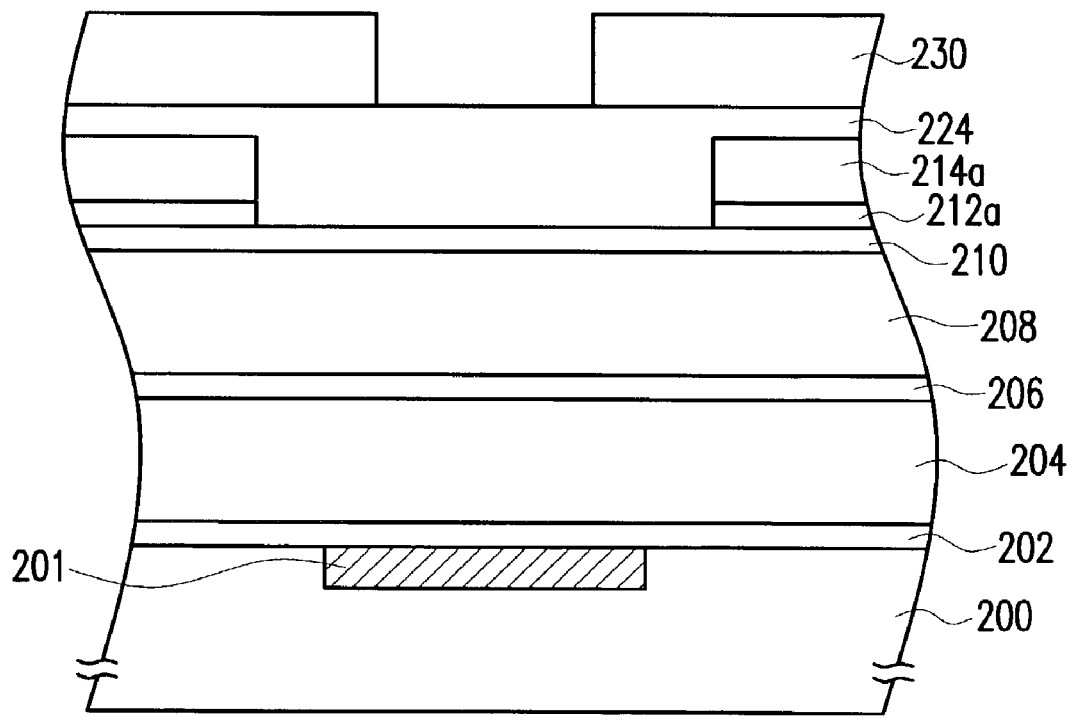

Referring to FIG. 2D, a BARC material layer 224 is formed by, for example, spin-on, on the patterned hard mask layer 214a and fill the opening 222. The material for the BARC material layer 224 can be, for example, fluid organic polymer, similar to the photoresist materials but without photosensitivity. The BARC material layer can act as an anti-reflection layer and fill the opening. Afterwards, a patterned second photoresist layer 230 is formed on the BARC material layer 224.

Figure 2E:
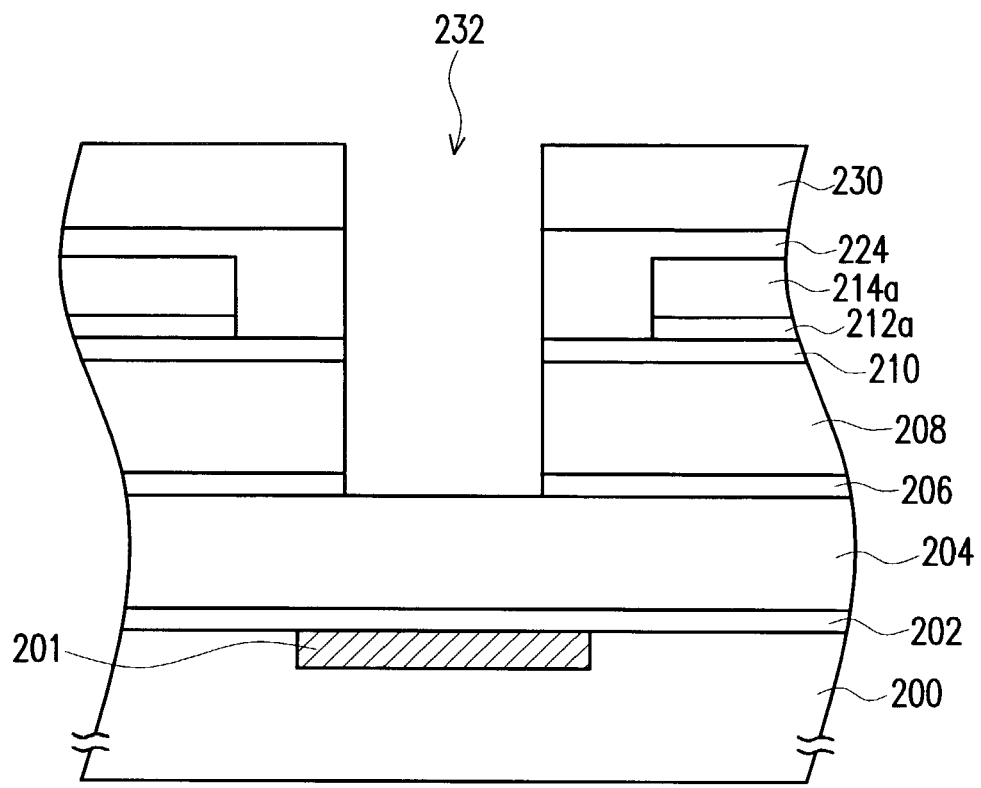

Referring to FIG. 2E, using the second photoresist layer 230 as a mask, a first anisotropic etching process is performed to remove the BARC material layer 224, the CMP stop layer 210, the second dielectric layer 208 and the etch stop layer 206, forming a via opening 232. The depth of the via opening 232 is adjustable, depending on the process needs. That is, the anisotropic etching can stop before, right at or after the etch stop layer 206, but without exposing the cap layer 202 and the metal wires.

Figure 2F:
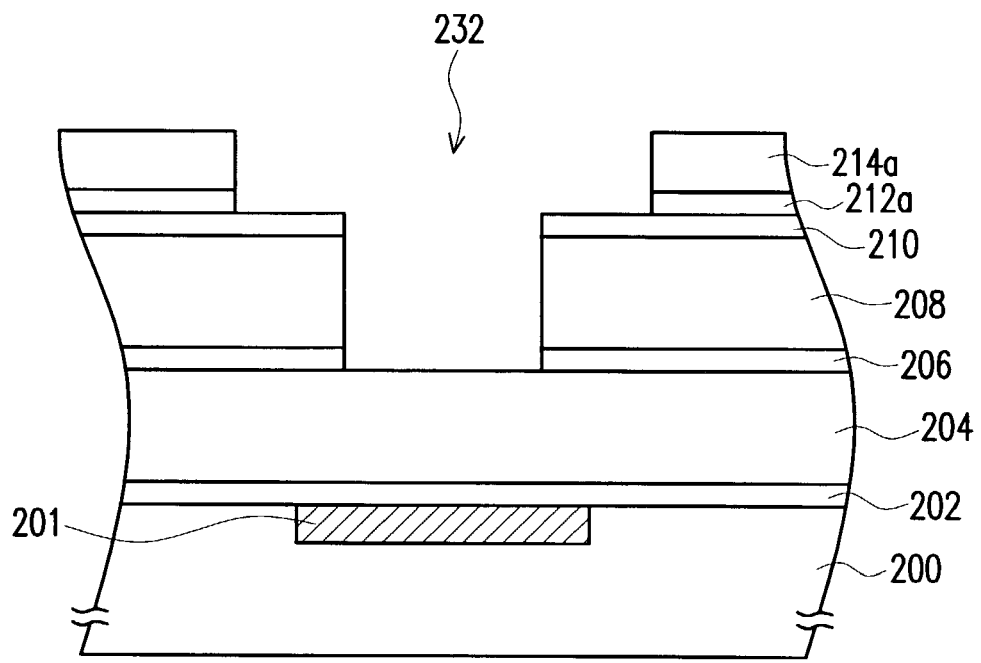

Referring to FIG. 2F, a plasma process is performed to remove the second photoresist layer 230. Because the material of the BARC material layer 224 is similar to the material of the photoresist layer 230, the BARC material layer 224 is removed along with the second photoresist layer 230.

Figure 2G:
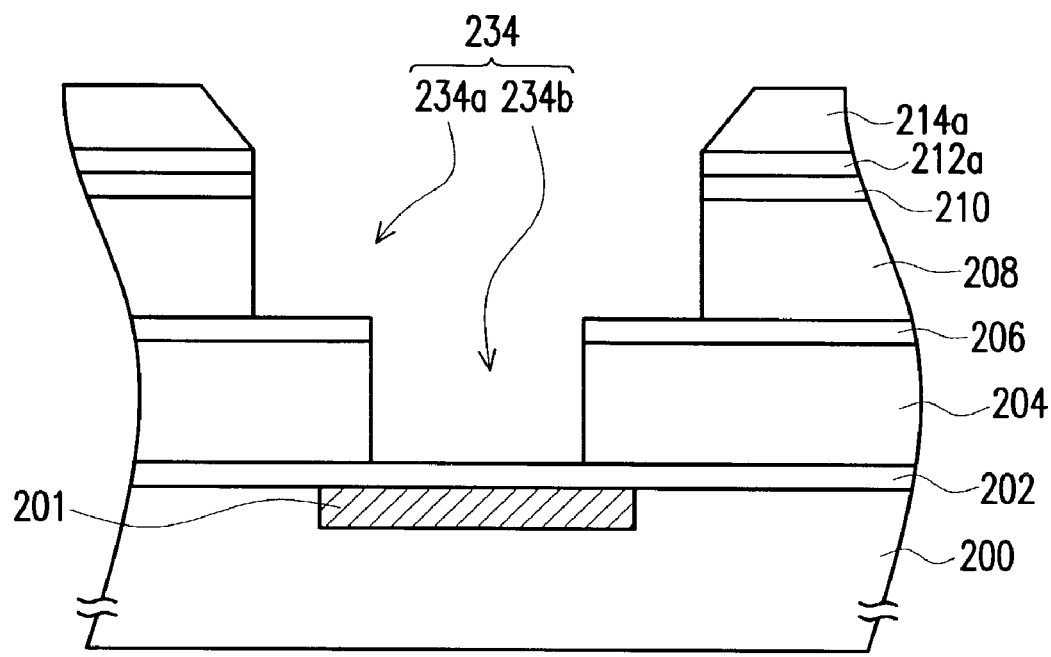

Referring to FIG. 2G, using the hard mask layer 214a and the metal hard mask layer 212a as a mask, a second anisotropic etching process is performed to form a damascene opening 234. The damascene opening 234 includes a trench opening 234a and a via opening 234b. By controlling the depth of the via opening 232 and the etching conditions, the trench opening 234a is etched until the etch stop layer 206 is exposed, while the via opening 234b is formed by using the cap layer 202 as an etch stop layer.

Although sidewalls of the via opening 232 is exposed to plasma damage for stripping the photoresist, the damaged sidewalls of the via opening 232 is removed during the second anisotropic etching process.

Figure 2H:
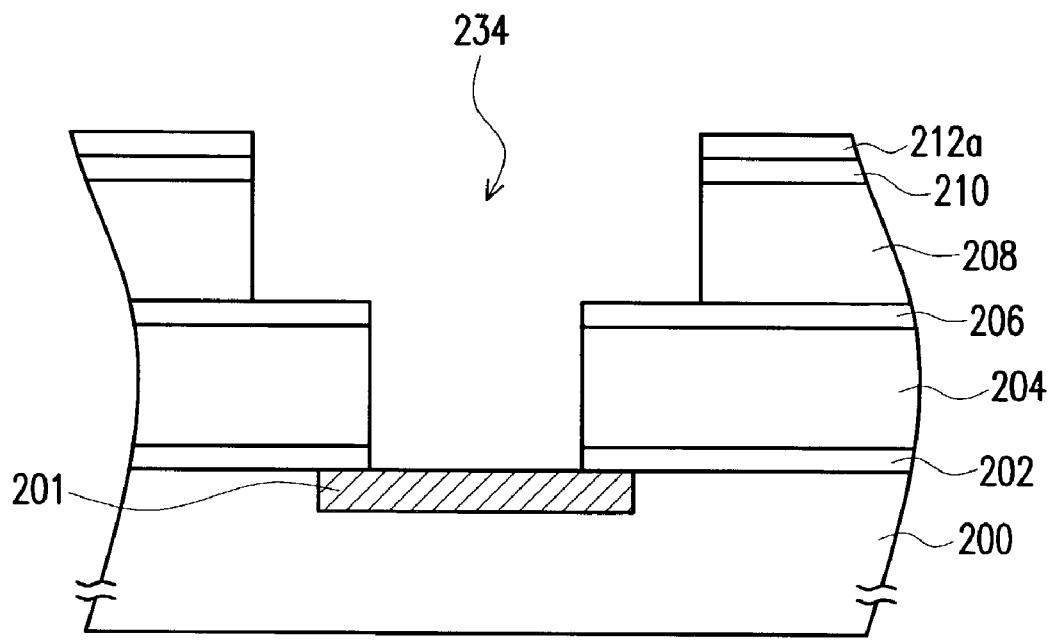

Referring to FIG. 2H, the cap layer 202 is removed to expose the underlying metal wires 201 within the substrate 200. The cap layer 202 can be removed either by wet etching or dry etching. If the hard mask layer 214a is made of the same material as the cap layer 202, for example, silicon nitride, the hard mask layer 214a is removed along with the cap layer 202.

Figure 2I:
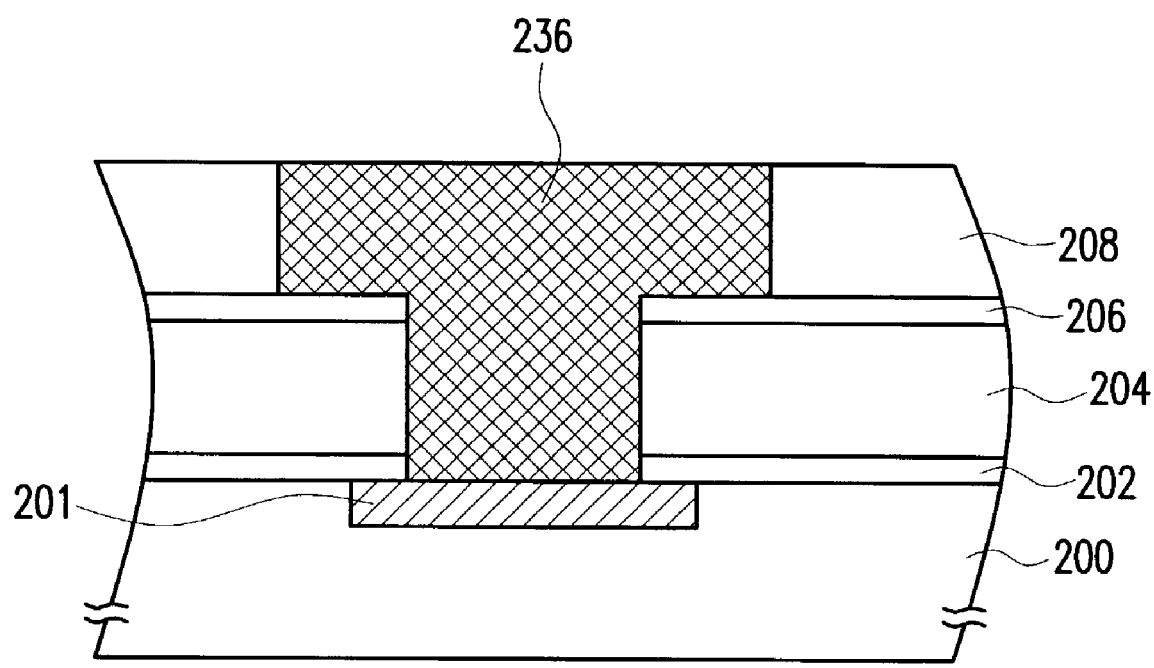

Afterwards, a conductive layer (not shown) is formed to fill the damascene opening 234. The material for forming the conductive layer includes aluminum, copper or other metals formed by sputtering or CVD. The conductive layer is then planarized by CMP using the CMP stop layer 210 as a polishing stop layer, so that a damascene interconnect 236 is formed within the opening 234, as shown in FIG. 2I. The metal hard mask layer 212a and the CMP stop layer 210 are removed during the CMP process.

The following processes are well known to persons skilled in the art, and will not be further described therein.

By using the patterned hard mask layer and the patterned metal hard mask layer as a mask along with the gap-filling BARC material layer, the low-k dielectric layers are protected from plasma damage for stripping the photoresist. Moreover, no gap filling process is required for the via opening, thus avoiding the fence profile.

FIGS. 3A–3H are cross-sectional views of the process steps for forming an opening in a dielectric layer according to another preferred embodiment of this invention.

Figure 3A:
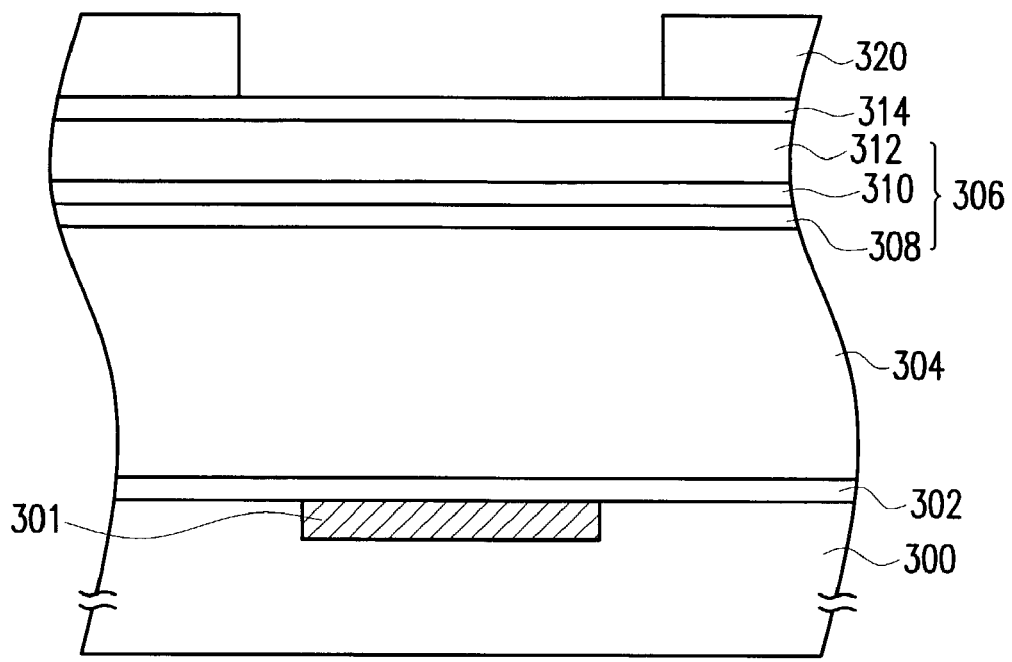
FIGS. 3A–3H are cross-sectional views of the process steps for forming an opening in a dielectric layer according to another preferred embodiment of this invention.

Referring to FIG. 3A, a semiconductor substrate 300 is provided. If a metal wire 301 is included in the substrate 300, a cap layer 302 is then formed on the substrate 300 and covering the metal wire 301. The cap layer is, for example, a nitride layer with a thickness of about 400–700 Å, preferably 500 Å. Afterwards, a dielectric layer 304 is formed over the substrate 300. The dielectric layer 304 can be a single layer or comprises stack layers including a first dielectric layer and a second dielectric layer. Optionally, a stop layer (not shown) can be included between the first and the second dielectric layers. The dielectric layer 304 is a low-k dielectric layer made of, for example, an inorganic polymer containing silicon, such as CORAL™ or Black Diamond™. The dielectric layer 304 is formed by, for example, CVD with a thickness of about 2000 Å to 3000 Å. For the dielectric layer 304 comprising stack layers, the first and second dielectric layers can be made of different dielectric materials, for example. The thickness of the dielectric layer is adjustable, depending on the structure formed on the substrate 300. Afterwards, a mask layer 306 is formed on the dielectric layer 304. The mask layer comprises at least a metal hard mask layer 310 and a hard mask layer 312. If needed, a chemical mechanical polishing (CMP) stop layer 308 is further included in the mask layer 304. An anti-reflection coating (ARC) layer 314 is formed on the mask layer 306. The CMP stop layer 308 is, for example, a silicon nitride layer or a silicon carbide layer with a thickness of about 400–700 Å, preferably 500 Å. Materials for forming the metal hard mask layer 310 includes tantalum, tantalum nitride, tungsten, tungsten nitride, titanium nitride and titanium, formed by, for example, CVD or sputtering. The metal hard mask layer 310 has a thickness of about 100–300 Å, preferably 200 Å. The hard mask layer 312 is, for example, a silicon nitride layer or a silicon carbide layer with a thickness of about 1000–2000 Å, preferably 1500 Å. The formation of the metal hard mask layer and the hard mask layer is one of the advantageous features of the present invention.

Afterwards, a patterned first photoresist layer 320 is formed on the ARC layer 314.

Figure 3B:
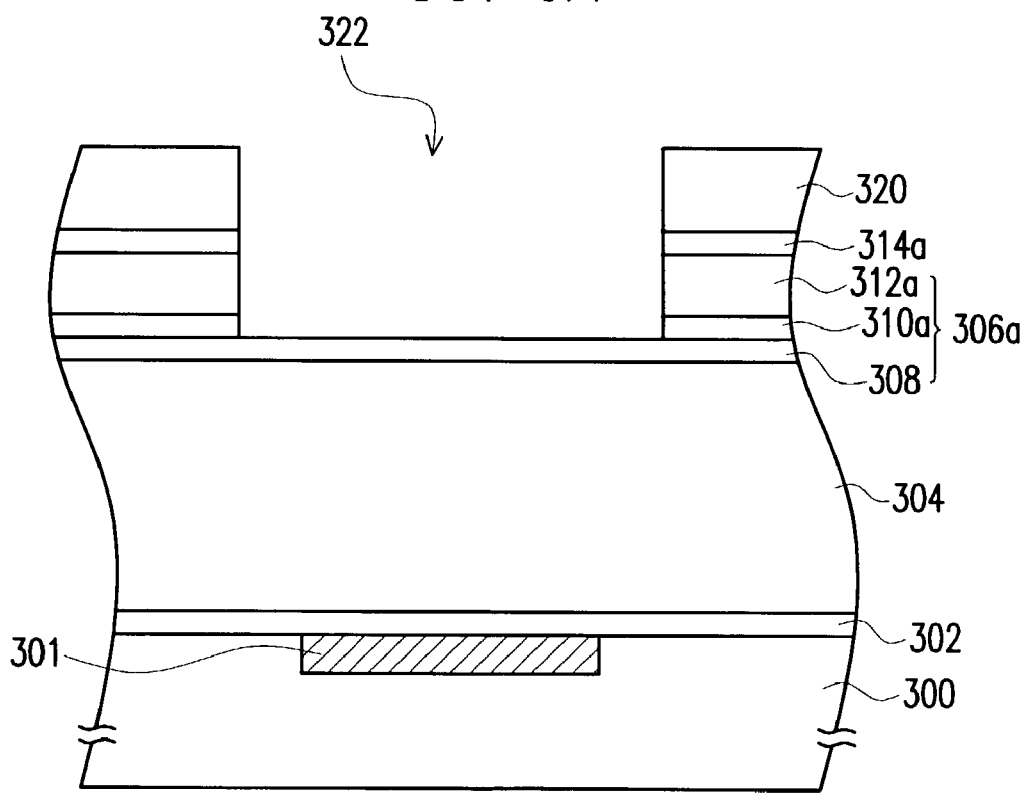

Referring to FIG. 3B, using the patterned photoresist layer 320 as a mask, the ARC layer 314, the hard mask layer 312 and the metal hard mask layer 310 are partially removed until the CMP stop layer 308 is exposed. Therefore, the patterned mask layer 306a (including the patterned hard mask layer 312a and the metal hard mask layer 310a) is obtained with an opening 322 formed within.

Figure 3C:
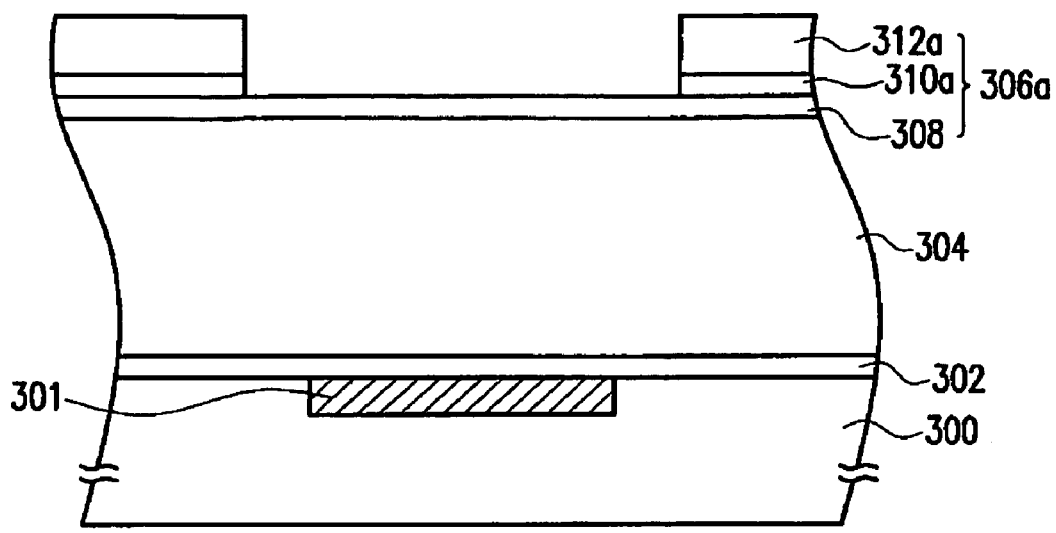

Referring to FIG. 3C, using plasma as a clean agent, the first photoresist layer 320 is removed. Because the material of the ARC layer 314 is similar to the material of the photoresist layer 320, the ARC layer 314a is removed along with the first photoresist layer 320.

Figure 3D:
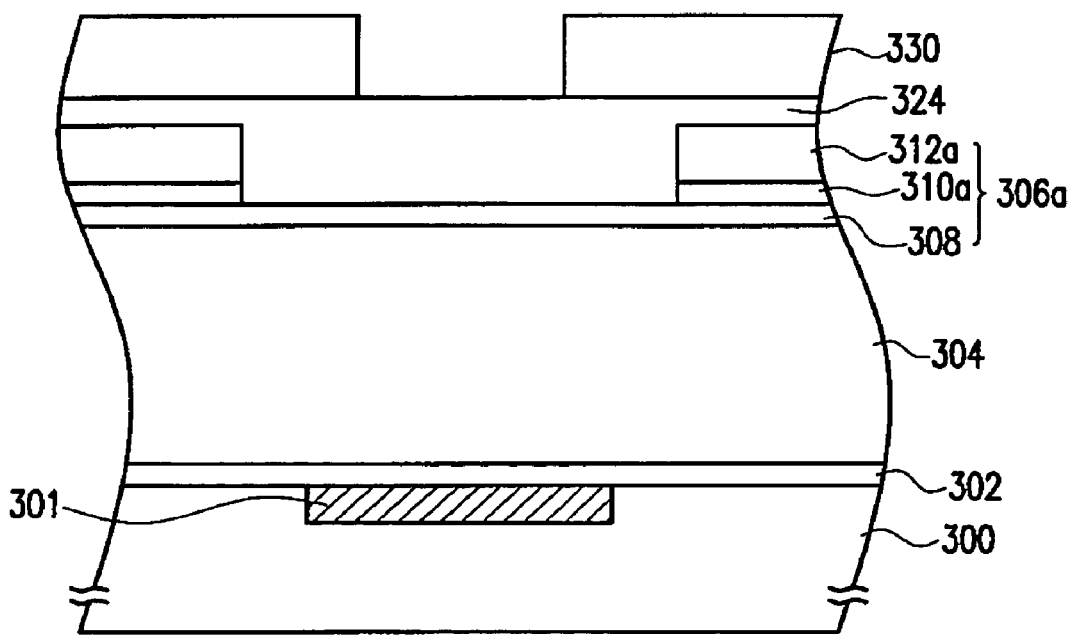

Referring to FIG. 3D, an ARC material layer 324 is formed by, for example, spin-on, on the patterned mask layer 306a and fills the opening 322. The material for the ARC material layer 324 can be, for example, fluid organic polymer, similar to the photoresist materials but without photosensitivity. The ARC material layer can act as an anti-reflection layer and fill the opening. Afterwards, a patterned second photoresist layer 330 is formed on the ARC material layer 324.

Figure 3E:
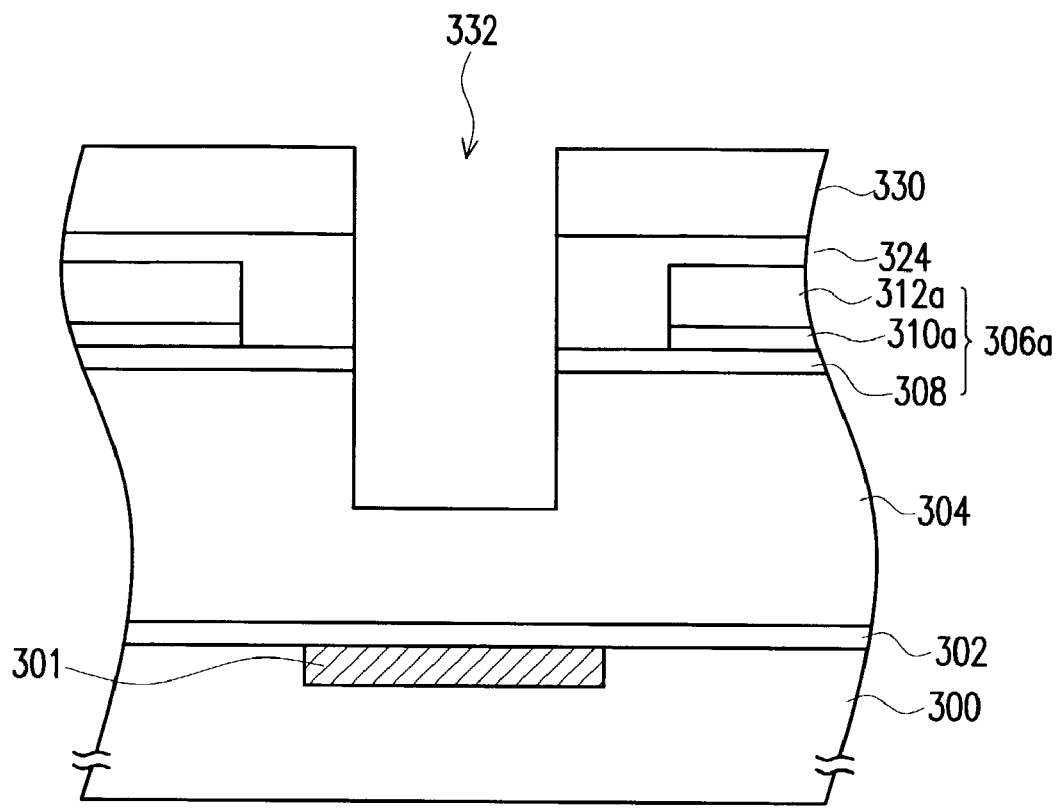

Referring to FIG. 3E, using the second photoresist layer 330 as a mask, a first anisotropic etching process is performed to partially remove the ARC material layer 324, the CMP stop layer 308 and the dielectric layer 304, forming a via opening 332. The depth of the via opening 332 is adjustable, depending on the process needs. That is, the anisotropic etching can stop in a first predetermined depth, but without exposing the cap layer 202 and the metal wires.

Figure 3F:
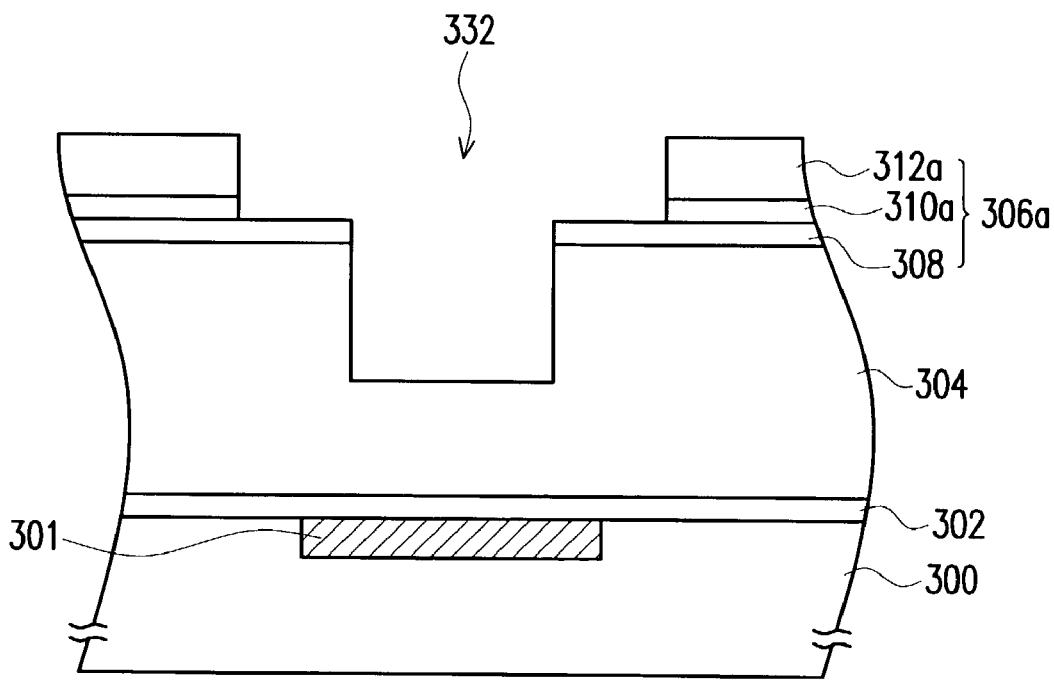

Referring to FIG. 3F, a plasma process is performed to remove the second photoresist layer 330. Because the material of the ARC material layer 324 is similar to the material of the photoresist layer 330, the ARC material layer 324 is removed along with the second photoresist layer 330.

Figure 3G:
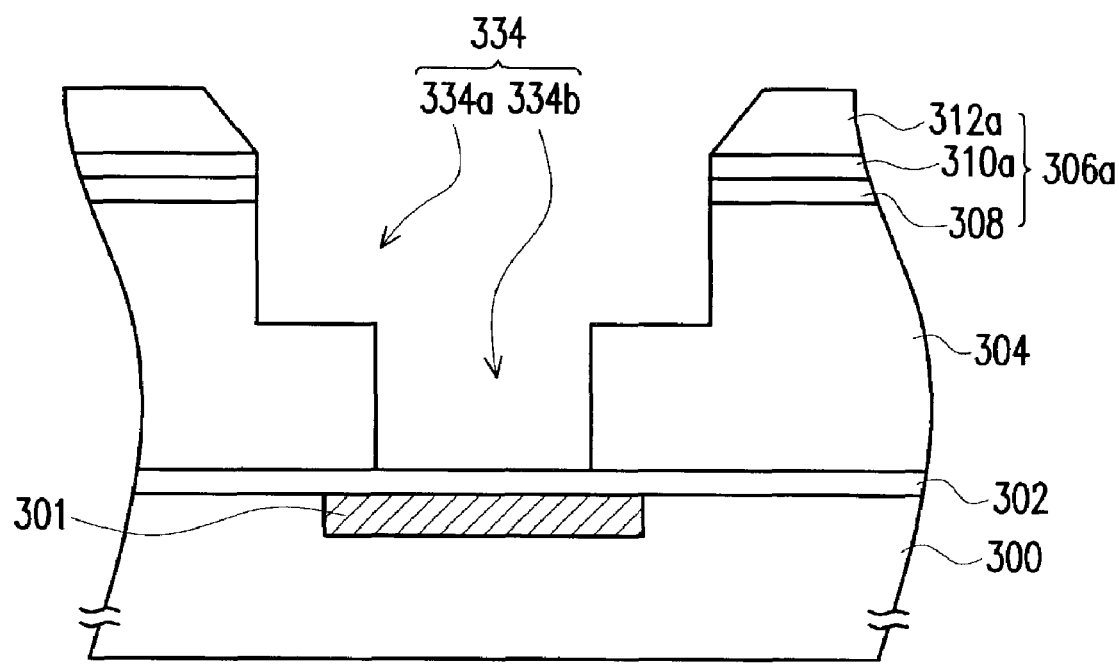

Referring to FIG. 3G, using the patterned mask layer 306a (i.e. the hard mask layer 312a and the metal hard mask layer 310a) as a mask, a second anisotropic etching process is performed to form a damascene opening 334. The damascene opening 334 includes a trench opening 334a and a via opening 334b. By controlling the depth of the via opening 332 and the etching conditions, the trench opening 334a is also etched to a second predetermined depth, while the via opening 334b is formed by using the cap layer 302 as an etch stop layer.

The resultant structure with the damascene opening at least comprising: the substrate, the dielectric layer with the damascene opening and the patterned mask layer that includes at least one metal hard mask layer and one or more hard mask layers on the dielectric layer. Before the mask layer is patterned, the structure for forming the opening further includes an anti-reflection layer on the mask layer.

Figure 3H:
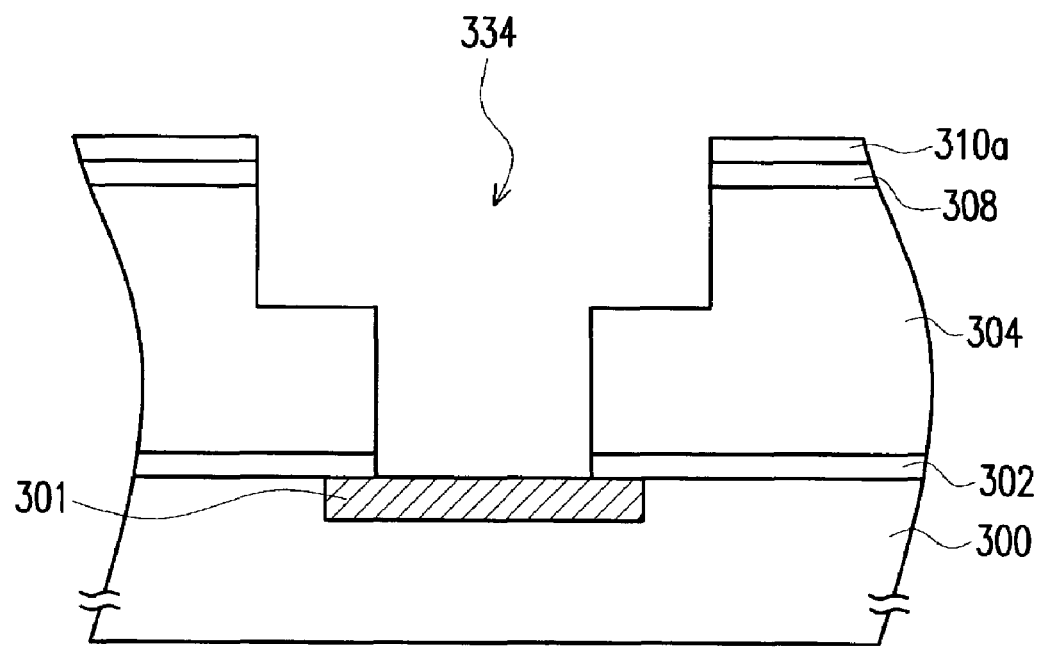

Referring to FIG. 3H, the cap layer 302 is removed to expose the underlying metal wires 301 within the substrate 300. The cap layer 302 can be removed either by wet etching or dry etching. If the hard mask layer 312 is made of the same material as the cap layer 302, for example, silicon nitride, the hard mask layer 312a can be removed along with the cap layer 302. Afterwards, an interconnect (not shown) can be formed within the opening 334, as shown in FIG. 2I. The following processes are well known to persons skilled in the art, and will not be further described therein.

However, the opening described herein is not limited to a damascene opening. Other types of openings, including via openings, trench openings and contact openings are within the scope of the present invention.

By using the patterned mask layer as a mask along with the gap-filling ARC material layer, the dielectric layer is protected from plasma damage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming an opening on a substrate, comprising:
    forming a first dielectric layer, a first stop layer, a second dielectric layer, a third dielectric layer, a plurality of hard mask layers at least comprising a metal hard mask layer, and a first anti-reflection layer sequentially on the substrate;
    forming a first opening to expose the third dielectric layer;
    removing the first anti-reflection layer;
    filling a second anti-reflection layer in the first opening;
    forming a second opening through the second anti-reflection layer, the third dielectric layer, the second dielectric layer, and the first stop layer into the first dielectric layer by a predetermined depth; and
    removing the second anti-reflection layer.

2. The method as claimed in claim 1, wherein materials for forming the first and second dielectric layers include inorganic polymer containing silicon.

3. The method as claimed in claim 1, wherein the first anti-reflection layer is a bottom anti-reflection coating layer.

4. The method as claimed in claim 1, wherein the second anti-reflection layer is a bottom anti-reflection coating layer made of fluid organic polymer.

5. The method as claimed in claim 1, wherein the metal hard mask layer is made of one of the following materials selected from the group consisting of tantalum, tantalum nitride, titanium, titanium nitride, tungsten and tungsten nitride.

6. The method as claimed in claim 1, wherein the hard mask layer is a silicon nitride layer or a silicon carbide layer.

7. The method as claimed in claim 1, wherein the first stop layer is a silicon nitride layer or a silicon carbide layer.

8. The method as claimed in claim 1, wherein the third dielectric layer is a second stop layer.

9. A method of forming an opening on a substrate, comprising:
   forming a dielectric layer, a stop layer, a plurality of hard mask layers at least comprising a metal hard mask layer, and a first anti-reflection layer sequentially on the substrate;
   forming a first opening to expose the stop layer;
   removing the first anti-reflection layer;
   filling a second anti-reflection layer in the first opening;
   forming a second opening through the second anti-reflection layer and the stop layer into the dielectric layer by a predetermined depth; and
   removing the second anti-reflection layer.

10. The method as claimed in claim 9, wherein materials for forming the dielectric layer include inorganic polymer containing silicon.

11. The method as claimed in claim 9, wherein the first anti-reflection layer is a bottom anti-reflection coating layer.

12. The method as claimed in claim 9, wherein the second anti-reflection layer is a bottom anti-reflection coating layer made of fluid organic polymer.

13. The method as claimed in claim 9, wherein the metal hard mask layer is made of one of the following materials selected from the group consisting of tantalum, tantalum nitride, titanium, titanium nitride, tungsten and tungsten nitride.

14. The method as claimed in claim 9, wherein the hard mask layer is a silicon nitride layer or a silicon carbide layer.

* * * * *